United States Patent [19]

Grabowski

[11] Patent Number: 5,363,694

[45] Date of Patent: Nov. 15, 1994

[54] AMPOULE RUPTURE DETECTION SYSTEM

[75] Inventor: Norman A. Grabowski, Pawcatuck, Conn.

[73] Assignee: United Technologies Corporation, Hartford, Conn.

[21] Appl. No.: 153,762

[22] Filed: Nov. 17, 1993

[51] Int. Cl.$^5$ ............................................. G01M 3/20
[52] U.S. Cl. .................................................. 73/40.7
[58] Field of Search ........................... 73/40.7, 49.3, 52

[56] References Cited

U.S. PATENT DOCUMENTS

| | | | |
|---|---|---|---|
| 3,988,920 | 11/1976 | Raab et al. | 73/40.7 X |
| 4,016,743 | 4/1977 | Henderson et al. | 73/40.7 X |
| 4,608,866 | 9/1986 | Berquist | 73/40.7 |

FOREIGN PATENT DOCUMENTS

| | | | |
|---|---|---|---|
| 2344008 | 3/1976 | France | 73/40.7 |
| 1218753 | 6/1966 | Germany | 73/40.7 |
| 223417 | 8/1968 | U.S.S.R. | 73/40.7 |
| 1619085 | 1/1991 | U.S.S.R. | 73/40.7 |

*Primary Examiner*—Thomas P. Noland
*Assistant Examiner*—Joseph W. Roskos
*Attorney, Agent, or Firm*—Donald S. Holland

[57] ABSTRACT

A detection or safety system is disclosed for preventing leakage of harmful gases when fragile ampoules break during heating of components in crystal growth experiments. In the preferred embodiment, the system includes an inner silica ampoule to house the components and reaction product; an outer silica ampoule that encases the inner ampoule, leaving a gap between them; an inert gas (preferably neon) that is normally trapped in the gap; and a metal canister that houses or contains the ampoules. If the pressure becomes too great within the inner ampoule, during heating by the crystal growth furnace, both ampoules may break. If that occurs, the neon is released, where upon its presence is sensed by a thermal conductivity detector ("TCD"). The TCD then sends off a signal to a controller which shuts off the furnace power. The resulting decrease in temperature releases the pressure and prevents the canister from being breached. This keeps potentially harmful gases contained within the canister, instead of escaping from the system.

9 Claims, 1 Drawing Sheet

AMPOULE RUPTURE DETECTION SYSTEM

BACKGROUND OF THE INVENTION

This invention relates in general to monitoring systems for chemical laboratories and more particularly to safety systems for crystal growth facilities.

There are a series of experiments scheduled to be conducted at the upcoming Space Station, in outer space. Some of these involve the Space Station's Furnace Facility. They will require monitoring systems to ensure successful experiments, as well as limit the possible hazards to the Space Station and crew. For example, the first furnace facility scheduled for operation will be the crystal growth furnace. Experiments there will center on the crystal growth of inorganic compounds.

In crystal growth operations on Earth, ampoules are typically used to house the components and reaction product. As the initial components are heated during the reaction process, they change phases and the pressure can build dramatically within the fragile ampoule. For example, when pure liquid arsenic is mixed with metal gallium to form gallium arsenide, GaAs, the heated arsenic changes from liquid to gas prior to reaction. This causes the pressure increase, up to about five-to-ten-fold. Rupture of ampoules are therefore common. The contamination problem is reduced on Earth because of gravity and dilution of the gaseous vapors (here, poisonous arsenic) into the atmosphere.

The ampoule rupture problem increases in severity in the Space Station Furnace Facility as the crystal growth furnace reaches its maximum temperature of 1350° C. In order to diminish to possibility of inorganic material escaping the furnace containment area, the ampoule is scheduled to be surrounded by a metal canister (as is sometimes used on Earth). However, this canister has the potential to be breached and, if that occurs unlike on Earth, there is nowhere for the gases to be vented. The minimum requirement would be for the entire furnace facility to be sealed and returned to the Earth for decontamination.

Accordingly, it is a general object of the present invention to provide a simple, fast method for determining an ampoule rupture in crystal growth formations at the Space Station.

It is another general object to provide an early detection technique to indicate ampoule rupture, prior to a canister being breached.

It is a more specific object to provide a monitoring system that will automatically shut off the crystal growth furnace if an ampoule ruptures, thereby reducing the internal pressure and maintaining canister containment.

It is yet another to provide a safety device that, while designed for space, has commercial application in the crystal growth field on Earth.

The above and other objects and advantages of this invention will become more readily apparent when the following description is read in conjunction with the accompanying drawing.

DETAILED DESCRIPTION OF THE PREFERRED EMBODIMENT

Figure 1:
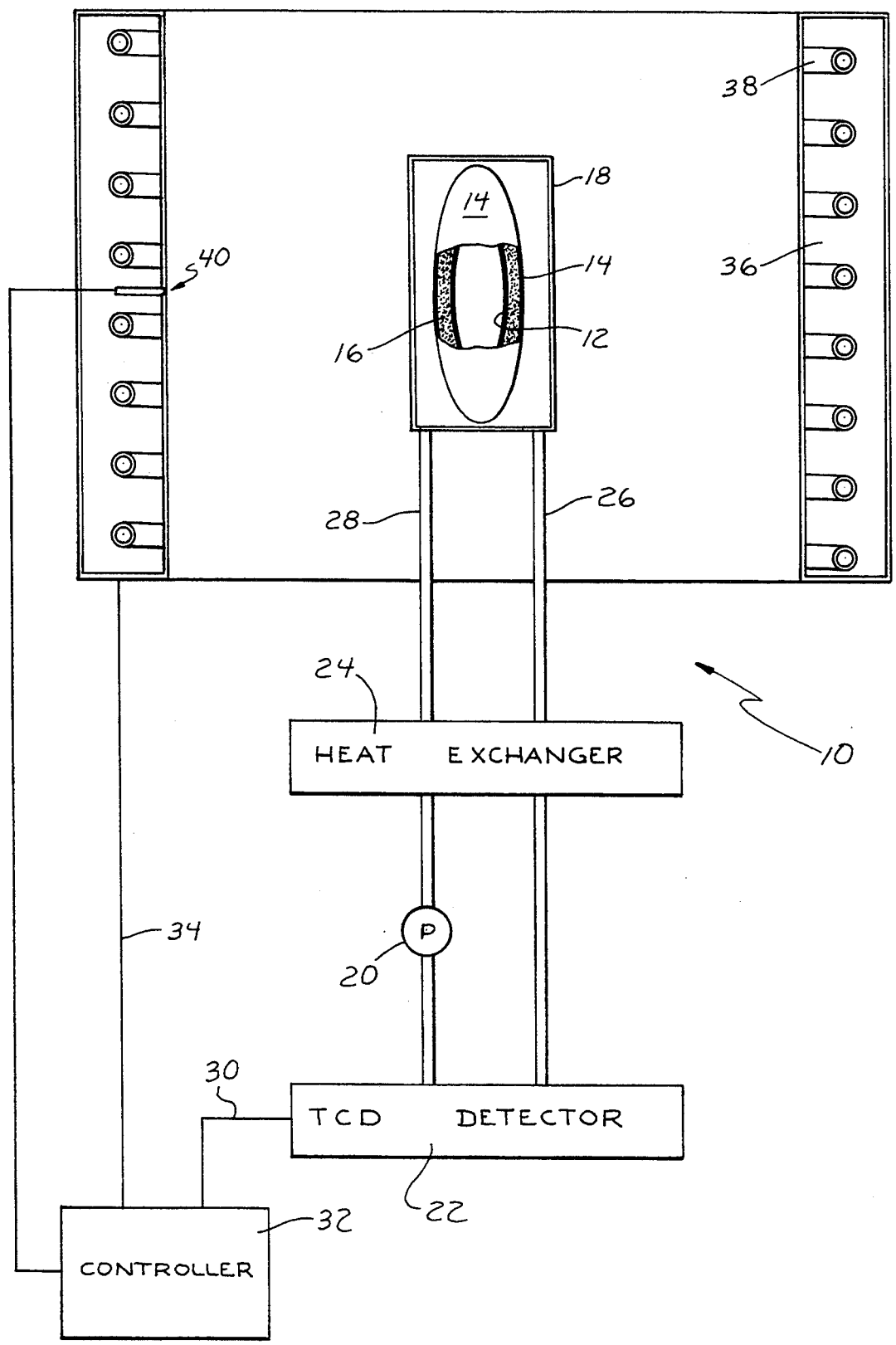
FIG. 1 is a schematic, partly in cross section, of an "Ampoule Rupture Detection System" constructed in accordance with the present invention.

Referring to the sole drawing in detail, a monitoring system for detecting ampoule rupture during crystal formation is illustrated and generally designated by the reference numeral 10. It is scheduled to be marketed by Hamilton Standard, a Division of United Technologies Corporation, for use at the Space Station.

Detection system 10 includes an inner ampoule or pod 12 which houses components and the reaction product (not shown); an outer, larger ampoule 14 that encases the inner ampoule 12, leaving a gap or spacing 16 between the outer wall of ampoule 12 and the inner wall of ampoule 14; and an inert gas (preferably neon) normally trapped within the gap 16. The ampoules are contained within a canister 18 that is part of a closed fluid loop, with the rest of the loop's components being: a rotary pump 20 to circulate another inert gas (preferably nitrogen or argon) around the ampoules and through the loop; a thermal conductivity detector ("TCD") 22 to monitor for ampoule rupture; and an optional heat exchanger 24 to keep the temperature of the circulated inert gas relatively constant, upstream and downstream of the canister 18.

Ampoules 12, 14 are preferably made of silica (quartz). Inner ampoule (outer wall) is approximately 8.0 cm×1.5 cm (diameter). Outer ampoule 14 (inner wall) is approximately 24.0 cm×2.3 cm (diameter).

Canister 18 is preferably made of high temperature stainless steel. Its dimensions are approximately 25.0 cm×2.5 cm (diameter).

Canister 18 has an inlet line 26 and an outlet line 28. The heat exchanger 24 is connected to both so that it mixes the temperature of the circulating gas as it enters and leaves canister 18.

Pump 20 is downstream of the canister and heat exchanger, in outlet line 28. Given the dimensions of ampoules 12, 14 and canister 18, this rotary pump should have a capacity of approximately one-half cubic foot per minute. Any standard rotary pump should suffice, since its purpose is merely to circulate inert gas(es) through the loop.

The TCD 22 is located downstream of pump 20. Outlet line 28 (from canister 18) goes into it and inlet line 26 (to canister 18) starts from it. The preferred TCD is Gow-Mac Model No. 10-077TCD, manufactured by Gow-Mac Instrument Company of Boundbrook, N.J. It contains a sensor (not shown) that references the gas normally circulating through the loop—here, nitrogen or argon.

TCD 22 is connected by signal line 30 to a programmable temperature controller 32. The preferred controller is Omega Model CN-2010, with remote set option, manufactured by Omega Engineering, Inc. of Stanford, Conn. It selectively provides electrical power (by signal line 34) to a standard tube furnace 36 that can be lowered, either manually or automatically, to heat the components within the canister 18 to start or speed up the reaction process.

As shown in the cross section of FIG. 1, tube furnace 36 is made of ceramic and contains a helical heating coil 38. A thermocouple is attached to the inner wall of furnace 36, at 40. It is connected to the controller 32, for sensing the heat generated by the furnace at any given time.

The operation of detection system 10 is described as follows. During the course of the entire crystal growth experiment, rotary pump 20 is continuously on, powered by a source not shown. If pressure becomes too great within inner ampoule 12, it shatters and generally breaks the outer ampouie 14 as well. This releases the inert gas (neon) previously trapped between the ampoules. As the neon circulates through the TCD 22, the TCD reads a conductivity spike and signals controller 32 that there is trouble. The controller 32 (through an existing software program) automatically turns off the furnace power, and the furnace 36 is then lifted away from the canister 18. The decrease in temperature significantly lowers the vapor pressure of the inorganic material and decreases the possibility of a canister breach.

It should be understood by those skilled in the art that obvious structural modifications can be made without departing from the spirit of the invention. Accordingly, reference should be made primarily to the accompanying claims rather than the foregoing specification to determine the scope of the invention.

What is claimed is:

1. In a crystal growth facility of the type in which inorganic components are heated by a furnace to form a crystallized reaction product, the improvement comprising:
   a. an inner ampoule that contains the components and reaction product;
   b. an outer, larger ampoule that is adapted in size and shape to encase the inner ampoule, leaving a gap between the ampoules;
   c. an inert gas normally trapped in the gap;
   d. a canister that houses the ampoules; and
   e. a detection means to sense the rupture of both ampoules and automatically shut off the heat generated by the furnace, thereby preventing the canister from breaking and maintaining within the canister any harmful gases from the previously heated components.

2. The crystal growth facility of claim 1 in which the detection means comprises a thermal conductivity detector that senses the presence of the inert gas within the facility after the ampoules rupture and the inert gas leaks out from between them.

3. The crystal growth facility of claim 2 in which the thermal conductivity detector is connected by a signal line to a programmable temperature controller that selectively supplies or denies electrical power to the furnace.

4. The crystal growth facility of claim 3 in which the ampoules are made of silica.

5. A detection system for monitoring ampoule rupture during the crystal growth of inorganic compounds, said system comprising:
   a. a canister containing:
      i. an inner ampoule that houses inorganic components that, when heated, change phase and react to form the crystal growth;
      ii. an outer, larger ampoule that is adapted in size and shape to encase the inner ampoule, leaving a gap between them in which a first inert gas is normally trapped;
   b. a furnace adjacent the canister to heat the components inside the ampoules;
   c. a pump connected to the canister as part of a closed fluid loop, to circulate a second inert gas over the ampoules and through the loop; and
   d. a detector in the loop that senses the presence of the first inert gas circulating through the loop if the ampoules rupture and the previously trapped inert gas leaks out from the gap between them.

6. The crystal growth facility of claim 5 further comprising a programmable temperature controller means that selectively supplies or denies electrical power to the furnace, wherein the controller is connected to the detector by a signal line and automatically shuts off the furnace power upon receiving a signal from the detector that the first inert gas is circulating through the loop.

7. A detection system for monitoring ampoule rupture during the crystal growth of inorganic compounds, said system comprising:
   a. a canister containing:
      i. an inner ampoule that houses inorganic components that, when heated, change phase and react to form the crystal growth;
      ii. an outer, larger ampoule that is adapted in size and shape to encase the inner ampoule, leaving a gap between them in which a first inert gas is normally trapped;
   b. a furnace adjacent the canister to heat the components inside the ampoules;
   c. a pump connected to the canister as part of a closed fluid loop, to circulate a second inert gas over the ampoules and through the loop; and
   d. a thermal conductivity detector having a sensor in the loop that detects rupture of the ampoules by sensing any presence of the first inert gas circulating through the loop; and
   e. a programmable temperature controller that is connected to the detector and selectively supplies electrical power to heat the furnace, wherein the controller automatically shuts off the furnace power upon receiving a signal from the detector that the ampoules have ruptured.

8. A safety method for crystal growth facilities in which inorganic components are heated by a furnace to form a crystallized reaction product, said method comprising:
   a. housing inorganic within an inner ampoule;
   b. encasing the inner ampoule within a larger outer ampoule, leaving a gap between them;
   c. filling the gap with an inert gas, so that it is trapped between the ampoules; and
   d. monitoring rupture of both ampoules by sensing the gas after it escapes from the gap.

9. The safety method of claim 8 further including the step of automatically shutting off a crystal growth furnace in response to sensing rupture of the ampoules.

* * * * *